United States Patent
Kimball et al.

(10) Patent No.: US 6,661,217 B2
(45) Date of Patent: Dec. 9, 2003

(54) WIDEBAND PRECISION CURRENT SENSOR

(75) Inventors: Donald Felt Kimball, San Diego, CA (US); Joseph L. Archambault, San Diego, CA (US); Walter Haley, Escondido, CA (US); Lennart Mathe, San Diego, CA (US)

(73) Assignee: Telefonaktiebolaget L.M. Ericsson (SE)

( * ) Notice: Subject to any disclaimer, the term of this patent is extended or adjusted under 35 U.S.C. 154(b) by 69 days.

(21) Appl. No.: 10/036,650

(22) Filed: Dec. 21, 2001

(65) Prior Publication Data

US 2003/0117123 A1 Jun. 26, 2003

(51) Int. Cl.[7] .......................... G01R 31/00; G01R 27/14
(52) U.S. Cl. .................... 324/76.41; 324/127; 324/616; 324/713
(58) Field of Search ........................... 324/76.41, 76.44, 324/76.75, 76.22, 77.11, 127, 126, 115, 140 R, 615, 95, 616, 713

(56) References Cited

U.S. PATENT DOCUMENTS

| | | | | |
|---|---|---|---|---|
| 3,652,949 A | * | 3/1972 | Szabo | 330/260 |
| 3,733,536 A | * | 5/1973 | Gillow et al. | 307/105 |
| 4,024,578 A | * | 5/1977 | Sanner et al. | 348/312 |
| 5,481,178 A | * | 1/1996 | Wilcox et al. | 323/287 |
| 5,602,464 A | * | 2/1997 | Linkowsky et al. | 323/272 |
| 5,610,532 A | | 3/1997 | Smith | 324/771 |
| 5,656,929 A | * | 8/1997 | Humpherys | 324/95 |
| 6,157,230 A | | 12/2000 | O'Toole et al. | 327/156 |
| 6,300,826 B1 | | 10/2001 | Mathe et al. | 330/10 |
| 6,316,975 B1 | | 11/2001 | O'Toole et al. | 327/156 |

FOREIGN PATENT DOCUMENTS

| | | |
|---|---|---|
| DE | 2852222 | 1/1980 |
| EP | 0565946 | 10/1993 |
| EP | 0875765 | 11/1998 |
| FR | 2590030 | 5/1987 |
| GB | 1585889 | 3/1981 |
| WO | WO 9848287 | 10/1998 |

OTHER PUBLICATIONS

Ghislanzone, L: "Magnetic Coupled Current Sensing Techniques for Spacecraft Power Systems", European Space Power. Madrid, Oct. 2–6, 1989, Proceedings of the European Space Power Conference, Noordwijk, ESA Publications, NL, vol. 1, pp. 323–327 XP000163967.

Utility patent application, Ser. No. 09/911,105, filed on Jul. 21, 2001, Apparatus and Method for Efficiently Amplifying Wideband Envelope Signals, 33 pp.

* cited by examiner

Primary Examiner—Anjan K. Deb
(74) Attorney, Agent, or Firm—Coats & Bennett, P.L.L.C.

(57) ABSTRACT

A wideband precision current sensor employs DC-coupled and AC-coupled sensing circuits to generate lower and higher frequency sense signals; which are combined to form a wideband output signal that is proportional to a wideband current of interest. The frequency response of the wideband output signal is substantially flat across a wideband frequency range, 0 to 30 MHz for example, based on matching the frequency response of the DC- and AC-coupled sensing circuits. In an exemplary application, the current sensor provides feedback to a supply voltage (Vdd) amplifier used in RF envelope elimination and restoration (EER) applications.

48 Claims, 5 Drawing Sheets

WIDEBAND PRECISION CURRENT SENSOR

BACKGROUND OF THE INVENTION

The present invention generally applies to current sensing applications, and particularly applies to precision sensing of wideband currents.

Many electrical circuit applications require current sensing. For example, many industrial control systems use current sensing to infer control system states, and for noise-tolerant signaling. Current sensing also has broad utility in power supply applications, particularly in load-current sensing circuits.

Regardless of specific application, current sensing circuits are generally required to measure current with some desired degree of precision. While many approaches to precision current sensing are available, some degree of compromise generally comes into play where high frequency current sensing is required. That is, a current sensing circuit suitable for measuring high-frequency current components, is often not well suited for accurate low frequency current measurement. Indeed, some high frequency current sensors omit DC measurement capability altogether. Conversely, precise low frequency current sensing circuits, which are generally capable of DC current measurement, often exhibit poor high frequency measurement performance.

This lack of combined low and high frequency measurement performance becomes particularly vexing in systems where wideband current sensing is required. Selected types of radio frequency (RF) modulators represent just one such type of system. The limitations of existing approaches to current sensing are exacerbated by the increasing operating frequencies of modern electronic systems. For example, in the RF context just mentioned, newer air interface standards, such as CDMA2000 and Wideband CDMA (W-CDMA), use modulation signals well into the MHz range.

BRIEF SUMMARY OF THE INVENTION

The present invention provides an apparatus and method for precisely sensing a wideband current of interest. In an exemplary embodiment, the apparatus comprises a current sensing element, a DC-coupled first sensing circuit, an AC-coupled second sensing circuit, and a summing/output circuit that outputs a wideband sense signal by combining and amplifying lower- and higher-frequency sense signals generated by the first and second sensing circuits, respectively. The current sensor of the present invention provides DC-accurate current sensing, combined with wideband operation.

By design, the first sensing circuit dominates at lower frequencies, while the second sensing circuit dominates at higher frequencies. Tuning the frequency characteristics of the first and second sensing circuits results in the wideband sense signal having a substantially flat overall frequency response across a frequency range spanning the desired operating bandwidths of the first and second sensing circuits. More specifically, by matching the frequency-sensitive gains of the first and second sensing circuits, the upper frequency roll-off of the first sense signal may be matched to the lower frequency roll-off of the second sense signal, such that lower and upper frequency components in the sensed current enjoy substantially matched signal gains.

In an exemplary embodiment, the apparatus comprises a current sensing circuit that may be used in both high-side and low-side current sensing applications. This flexibility derives in part by configuring a current sensing element as a series sense resistor through which the sense current passes in either source or sink fashion with respect to the load. With this configuration, the sense resistor develops a wideband differential voltage signal proportionate to the current flowing through the sense resistor.

The first sensing circuit comprises an amplifier circuit differentially coupled to the sense resistor. Preferably, this amplifier circuit includes a common mode and differential mode input filter. By using an input filter, the range of frequency components seen by the differential amplifier is limited to a desired upper value, and this may prevent sensing errors with some types of integrated amplifiers. That is, it may not be desirable to present the full bandwidth of the differential sense voltage to the differential amplifier. In any case, the differential amplifier circuit preferably includes an instrumentation amplifier for amplifying the lower-frequency components of the differential voltage signal. Use of the instrumentation amplifier configuration provides good rejection of common mode signals at the sense resistor.

The second sensing circuit comprises a voltage-mode transformer that generates the second sense signal responsive to the higher-frequency components of the differential sense signal. By configuring this transformer as a voltage-mode device rather than a current-mode device, the winding inductance of the transformer is not placed in series with the sense resistor, which is undesirable given the wideband nature of the sensed current. A first one of the transformer's windings is placed in parallel with the sense resistor, such that the second winding of the transformer outputs a sense signal responsive to the higher-frequency differential voltages across the first winding. Preferably, the transformer is configured as a segment-wound toroidal transformer to provide good rejection of common-mode signals at the sense resistor. Further, the transformer preferably uses a core material having a relatively high permeability, such that its saturation characteristics favor high frequency operation (e.g., 30 MHz signal generation).

In an exemplary application, the wideband current sensor of the present invention generates a feedback signal used to control a supply voltage (Vdd) amplifier that forms part of an envelope elimination and restoration (EER) system in a radio frequency amplifier. However, those skilled in the art will recognize the broader utility of the present invention upon reading the following description, and in light of the supporting drawings.

DETAILED DESCRIPTION OF THE INVENTION

Because of the broad range of applications that use or require precision current sensing, the following discussion of exemplary current sensing details does not attempt an exhaustive treatment of such applications. However, the discussion does detail an exemplary application of the present invention in radio frequency signal modulation using envelope-elimination-and-restoration (EER) techniques. The reader should not construe any context-specific examples given herein as limiting the present invention.

Figure 1:
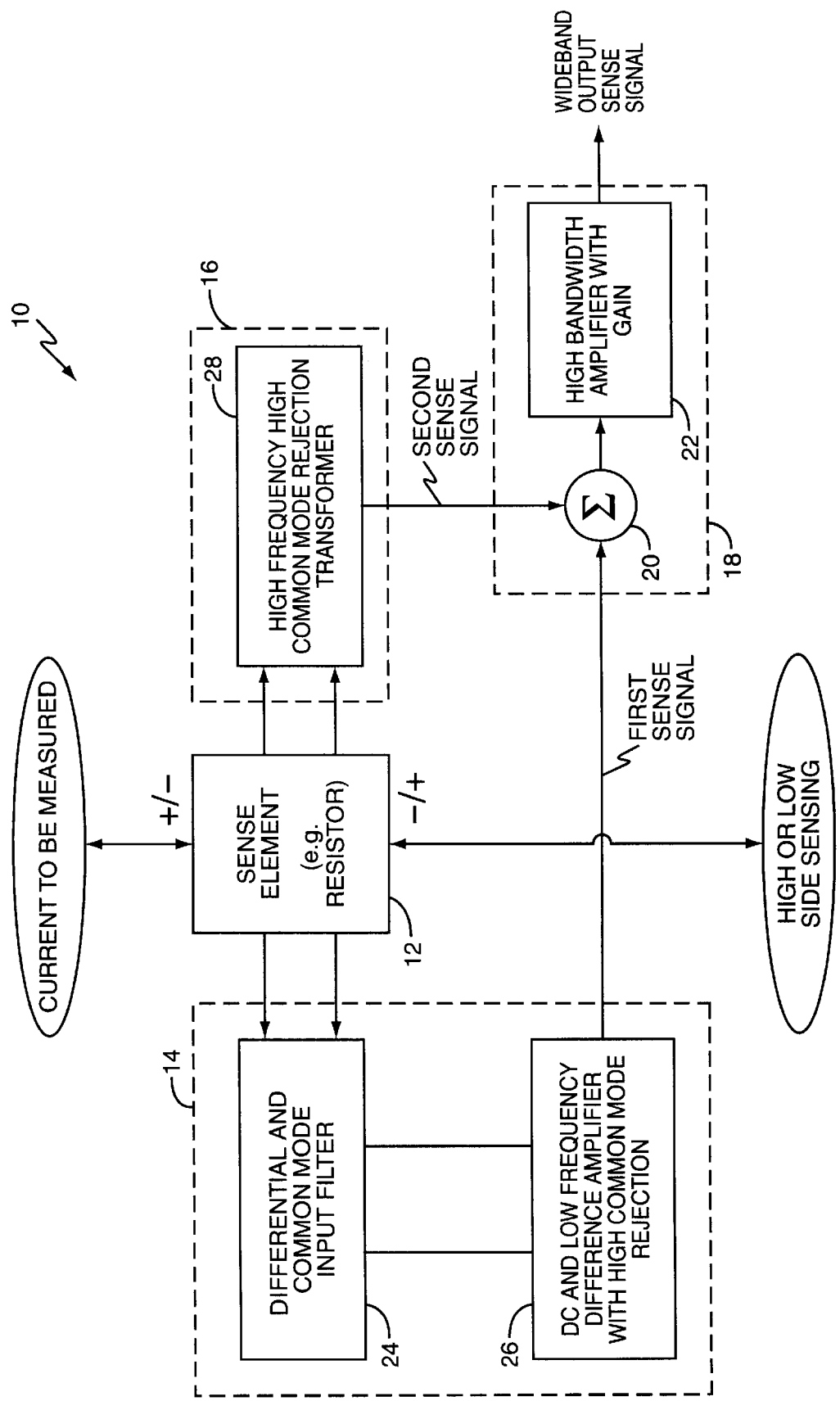
FIG. 1 is a diagram of an exemplary current sensor circuit.

Turning now to the drawings, FIG. 1 is a diagram of an exemplary embodiment of a current sensor 10 in accordance with the present invention. Generally, the current sensor 10 offers precision current sensing from low frequencies, including DC, up to a desired upper frequency. For example, with the appropriate configuration, current sensor 10 provides precision current sensing from DC to approximately 30 MHz. Of course, component selections and physical layout offers designers the opportunity to tailor the current sensor 10 to specific applications.

The exemplary current sensor 10 comprises a sense element 12, first and second sensing circuits 14 and 16, respectively, and an output circuit 18. The sensing element 12, which may be a sense resistor, is placed in series with an external load or device (not shown). The output circuit 18 comprises a summing circuit 20 and output amplifier circuit 22, while the first sensing circuit 14 comprises a common mode and differential mode filter and amplifier circuits 24 and 26, respectively. The second sensing circuit 16 comprises voltage-mode transformer circuit 28.

Circuit operation is essentially the same regardless of whether the current sensor 10 operates as a high-side (source) current sensor, or as a low-side (sink) current sensor. In either case, the sensed current flows through the sense element 12, which induces a differential voltage signal across the sense element 12 proportional to the sensed current. In exemplary embodiments, the sensed current is a wideband signal, having frequency components of interest from DC to some relatively high upper limit (e.g., tens of MHz).

The first sensing circuit 14 generates the first signal as a voltage-mode signal responsive to the lower frequency components of the wideband differential voltage signal developed across the sense element 12. The second sensing circuit 16 generates the second signal as a voltage-mode signal responsive to the higher frequency components of the wideband differential voltage signal. These first and second signals are coupled to summing inputs of the output circuit 18. Specifically, the first and second signals are coupled to summing inputs of a summing circuit 20, which then provides a combined, pre-amplified sense signal to an output amplifier circuit 22. The output sense signal from the amplifier circuit 22 is a wideband output signal representing an amplified version of the combined sense signal formed by the summing circuit 20. That is, the frequency components of the wideband output signal include the lower frequency contributions of the first signal output by the first sensing circuit 14, and the higher frequency contributions of the second signal output by the second sensing circuit 16.

By design, the frequency-sensitive signal gains of the first and second sensing circuits 14 and 16 are matched such that the overall frequency response of the output sense signal exhibits a substantially flat frequency response across a frequency range of interest. From one perspective, the first sensing circuit 14 is responsive from DC to some upper roll-off frequency $f_1$, beyond which it contributes very little to the output sense signal. The second sensing circuit 16 is responsive from some lower roll-off frequency $f_2$, below which it contributes very little to the output sense signal. By matching these upper and lower frequency roll-offs, the signal gain of the wideband output signal relative to the original wideband signal components of the differential voltage signal may be made substantially flat across a wideband range of frequency.

Figure 2:
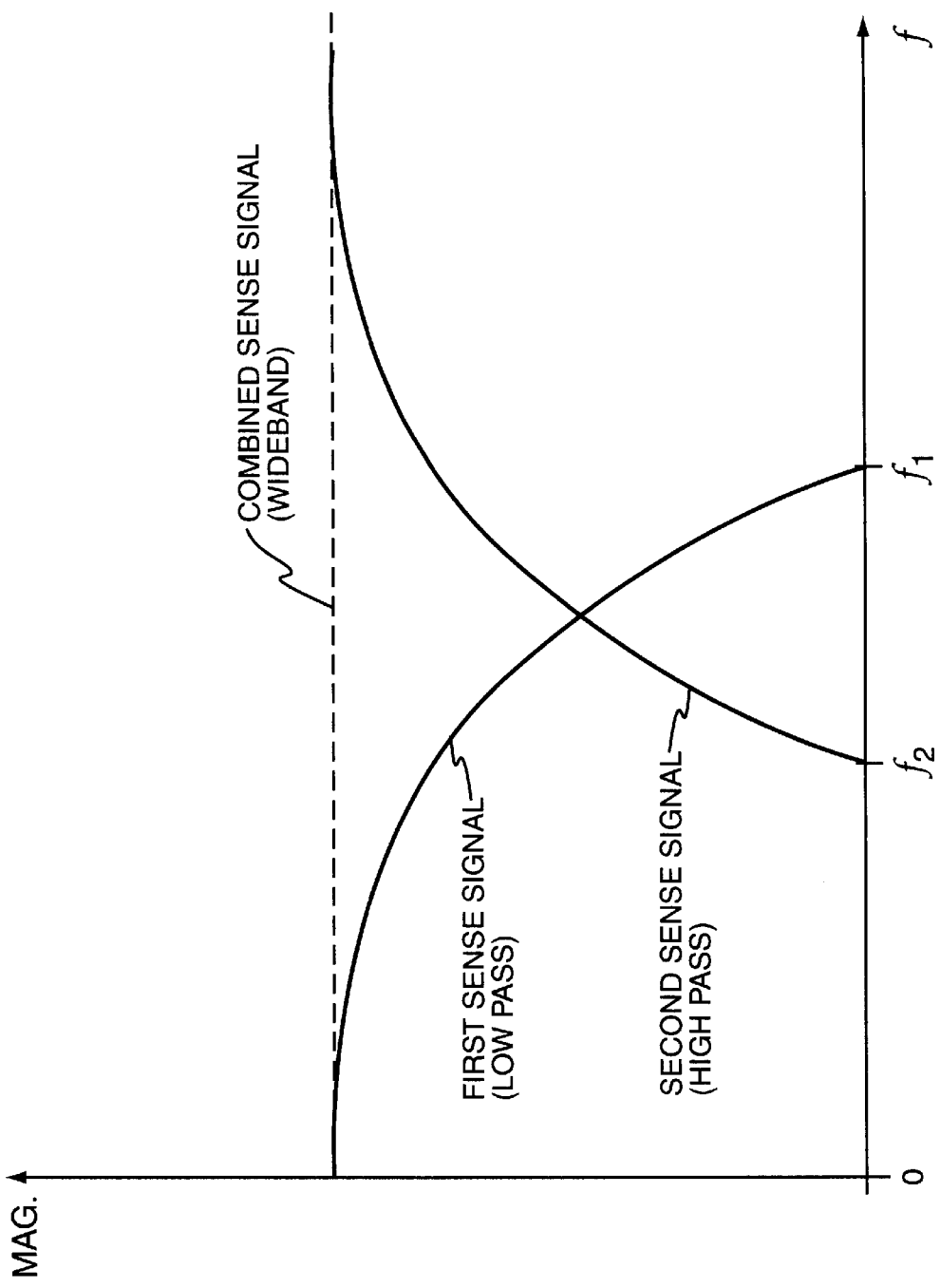
FIG. 2 is a graph of selected frequency response curves for the circuit of FIG. 2.

FIG. 2 provides a generalized approximation of this roll-off matching and depicts the first and second signals, along with the resultant wideband output signal. Note that no attempt is made to illustrate any particular signal gain for the wideband output signal.

Figure 3:
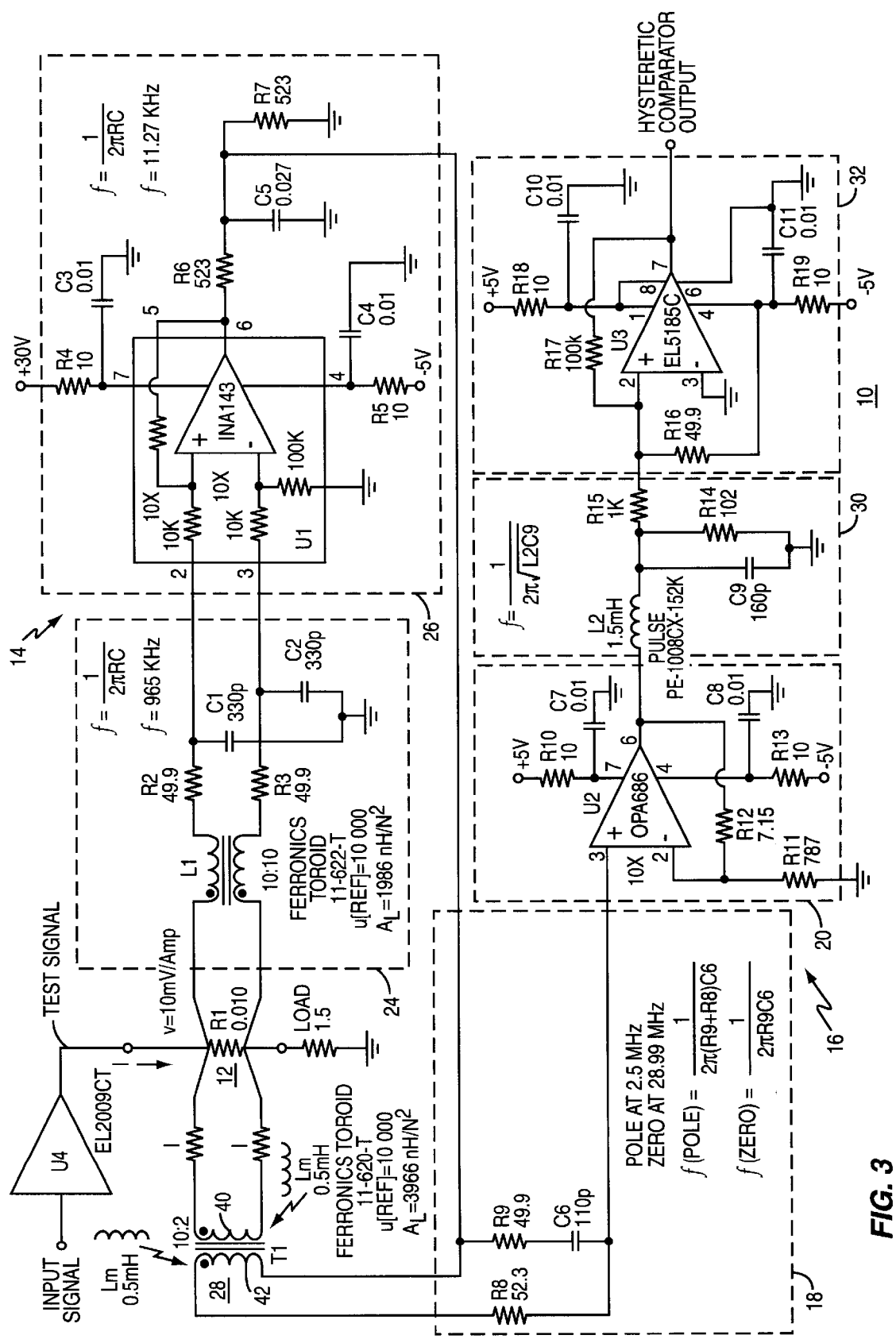
FIG. 3 is a diagram that provides exemplary schematic details for the functional circuit of FIG. 1.

While the current sensor 10 has broad applicability, FIG. 3 illustrates an exemplary embodiment that is configured for use in EER-based RF signal modulation. Component values, as given, represent exemplary choices for a specific configuration of the current sensor 10, as applicable to sensing current in the zero-to-five Amp range, and with frequency components of interest spanning from DC to 30+ MHz. While many of the components illustrated need meet only typical requirements, some aspects of this detailed circuit presentation merit elaboration.

For example, sense element 12 is depicted as sense resistor R1. Preferably, R1 has a relatively low series resistance and exhibits low inductance. A low resistance for R1 minimizes the amount of power dissipated by the current sensor 12, while a low inductance minimizes the sense resistor's reactance at higher frequencies. In the illustration, the current sensor 10 is configured for high-side operation, and a test signal from amplifier U4 flows through sense resistor R1 into a 1.5 Ohm load. Thus, the differential voltage signal developed across R1 is responsive to the current into the load.

The first sensing circuit 14 is DC coupled to R1 through a RF choke L1, which comprises a portion of the common mode and differential mode filter 24. The ratio of the common mode to differential mode inductance is preferably set to a ratio of about 100:1. This setting maintains the desired differential mode pass-band, increases attenuation in the desired differential mode stop-band, maximizes the common mode stop-band, and maximizes the common mode attenuation. An exemplary choke may be constructed using an 11–622-T toroidal core from Ferronics, Inc., a manufacturer of ferrite components and assemblies having a business address of 45 O'Connor Road, Fairport, N.Y. 14450. The filter 24 further comprises low-pass RC filters on each differential signal line (R2/C1, R3/C2), to provide further high frequency roll-off on the inputs of the differential amplifier circuit 26.

Depending on the characteristics of amplifier U1 used in the amplifier circuit 26, the filter 24 may or may not be needed. Some integrated circuit differential amplifiers exhibit increased output voltage offset if their input signals are not adequately band-limited. In an exemplary embodiment, U1 is implemented as a Burr-Brown INA143 instrumentation amplifier (IA), which amplifier is available from Texas Instruments Incorporated, having a business address of 12500 TI Boulevard, Dallas, Tex. 75243–4136.

Whether or not it is based on an instrumentation-amplifier topology, the differential amplifier circuit 26 is preferably configured for low output offset voltage, linear amplification within desired frequency limits, and high common-mode signal rejection. With high common-mode signal rejection, the common-mode operating range of the current sensor 10 is extended, yielding advantages in terms of the range of applications to which it is suited. Here, "common-mode" is with respect to the sense element 12.

Amplifier circuit 26 further includes an output filter (R6 and C5) that provides the first sense signal as an output.

Here, R6 and C5 provide a single-pole, low-pass output filter that band-limits the first sense signal, and establishes at least in part the upper frequency roll-off to $f_1$ illustrated in FIG. 2. It should be understood that multiple-pole filters might be implemented where needed or desired.

The first sense signal is coupled to an input of the summing circuit 20, and to one of the windings of the voltage-mode transformer 28 within the second Sensing circuit 16. This same transformer winding from transformer 28 is coupled to a second summing circuit input, thereby providing the Summing circuit 20 with the second sense signal. The summing circuit 20 comprises input filtering formed from resistors R8 and R9, and capacitor C6. This input filtering may be tailored to compensate for any reactance in the sense element 12 (i.e., R1).

The summing circuit 20 forms a pre-amplified sense signal by combining the first and second sense signals. This combined signal is then amplified according to a desired gain by the output amplifier circuit 22, which is preferably a wideband linear amplifier such as an OPA686, also from the Burr-Brown line of pans offered by Texas Instruments incorporated.

In this particular application, the output amplifier circuit 22 provides the wideband output sense signal to an output filter 30, which in turn provides a band-limited version of the output sense signal to a hysteretic comparator circuit 32. As shown later in FIG. 5, the output from the hysteretic comparator circuit 32 may be used to drive a switching controller (not shown) in EER applications. Band-limiting the output sense signal via finer 30 imposes an upper limit on the switching signal frequency generated by the comparator circuit 32, which limits the operating frequency of the switching controller.

The upper frequencies of the output sense signal, before filtering by the output filter 30, are determined by the characteristics of the second sensing circuit 16 and the output circuit 18. Transformer 28 may be tailored to achieve the desired frequency range for the second sense signal, which sets the upper limit for the output sense signal. Preferably, the transformer 28 is configured for high-frequency operation and good common-mode signal rejection.

Figure 4:
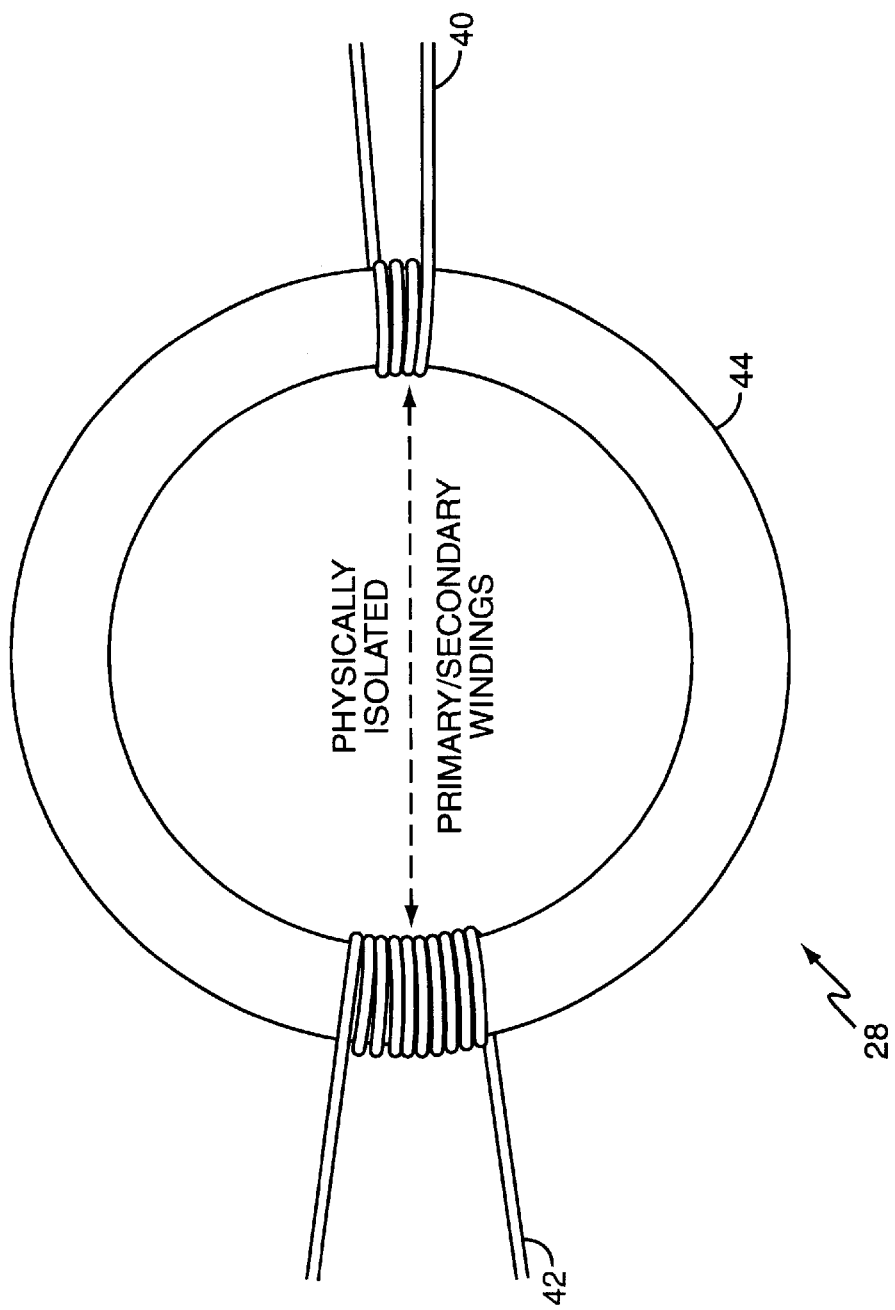
FIG. 4 is a diagram of an exemplary segment-wound toroidal transformer.

FIG. 4 details an exemplary configuration for the transformer 28. As noted, transformer 28 is implemented as a voltage-mode device, which benefits current sensing operations by not placing the transformer's winding inductance into the signal path of the current of interest. As a further advantage, the transformer's windings are not wetted by the sensed current, which, in some applications, may be several Amps in magnitude. Because the transformer windings do not carry the sensed current, more design choices are available, such as wire gauge, etc. Referring to FIG. 3 again, note that the first winding 40 of the transformer 28 is coupled in parallel to the sense element 12 (R1) through series resistors (here, exemplary 1 Ohm resistors). By sizing the resistance value of these series resistors to be much larger than the series resistance of the sense element 12 (1>>0.01), substantially all of the sense current flows through the sense element 12. Similarly, the sensed current sees relatively high impedance looking into the differential inputs of the filter 24.

To achieve high common-mode signal rejection, the transformer's primary and secondary windings (windings 40 and 42) are physically separated on the transformer core 44. The core 44 is preferably implemented as a toroid made of high permeability material (e.g., permeability in the range of 10,000$\mu$). The high permeability of the core 42 resists core saturation at higher operating frequencies, while the segment wound configuration minimizes inter-winding capacitance between windings 40 and 42. It should be understood that the details of transformer 28 would vary with specific design considerations. The 11–620-T toroid core available from Ferronics, Inc., represents an exemplary core choice, and may be wound in accordance with given design criteria.

In any case, the Circuits of FIG. 3 may be advantageously applied in EER applications, where the supply voltage (Vdd) of a saturated power amplifier (PA) is modulated in accordance with an amplitude modulation signal to impart desired amplitude modulation to the PA output signal. For a detailed presentation of an exemplary Vdd amplifier, the reader is referred to U.S. Pat. No. 6,300,826 B1 issued to Mathe et al. ('826 patent), which is incorporated in its entirety herein by reference. Related U.S. Pat. No 6,583,664 B2 also issued to Mathe et al. includes additional Vdd amplifier details, and is incorporated in its entirety herein by reference. The below discussion provides limited Vdd amplifier details, with its focus art use of the exemplary current sensor 10.

Figure 5:
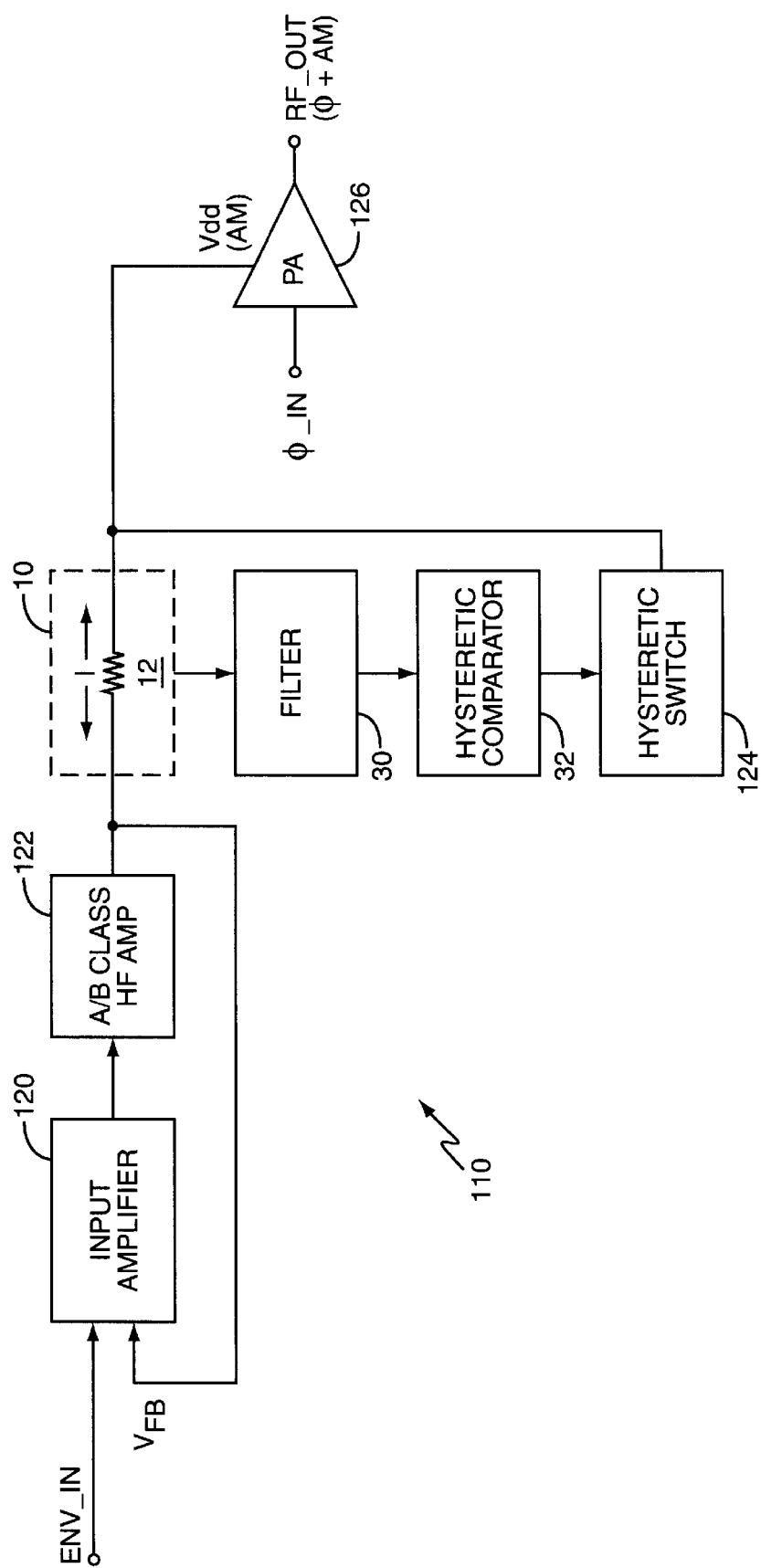
FIG. 5 is a diagram of a supply voltage amplifier using an exemplary current sensor circuit configured according to the present invention.

FIG. 5 illustrates an exemplary Vdd amplifier circuit 110, which comprises an input amplifier 120, a wideband linear amplifier 122, current sensor 10, filter 30, comparator circuit 32, and a switching controller 124. In an exemplary embodiment for use with W-CDMA applications, the current sensor 10 is configured like or similar to that shown in FIG. 3. As such, current sensor 10 provides precision current sensing for Vdd modulation control over a frequency range spanning from DC to more than 30 MHz.

In the context of the '826 patent, the input amplifier 120 receives an amplitude modulation signal ENV_IN, which represents the desired envelope of the PA output signal. The input amplifier 120 buffes this input signal into the relatively wideband linear amplifier 122, which is preferably an A/B class amplifier. The output from amplifier 122 is coupled to the Vdd supply voltage input of a PA 126 through sense element 12 of the current sensor 10. Thus, circuit 110 provides PA 126 with an amplitude-modulated Vdd supply voltage PA 126 receives a constant-envelope, phase-modulated signal at its input and, therefore, generates a RF output signal that includes both phase and amplitude modulation. This type at RF output signal generation is useful, for example, in CDMA2000 and W-CDMA base stations.

Current sensor 10 provides a feedback signal to the comparator circuit 32 via the filter 30, which then drives switching controller 124. Filtering the feedback signal using filter 30 operates to limit the maximum switching frequency. The feedback signal is responsive to both low and high frequency components of the current through sense element 12 and, in combination with a negative voltage feedback signal from amplifier 122 to input amplifier 120, may be used to control the amount of low frequency power output by amplifier 122. Again, more detailed treatment of this operation appears in the '826 patent. In general, the circuit 110 may be configured such that the more efficient switching controller 124 provides low frequency power to the load based on sensing current into the load via the exemplary current sensor 10 of the present invention.

Of course, the current sensor 10 of the present invention finds broad applicability in a range of applications beyond its exemplary use in EER applications. Therefore, the foregoing discussion should not be construed as limiting the present invention. Rather, the present invention is limited only by the scope of the following claims, and the reasonable equivalents thereof.

What is claimed is:

1. A wideband current sensor comprising:
   a sense element to generate a differential voltage signal proportional to a sensed current;
   a first sensing circuit DC-coupled to the sense element to generate a first signal proportional to lower frequency signal components of the differential voltage signal;
   a second sensing circuit AC-coupled to the sense element to generate a second signal proportional to higher frequency signal components of the differential voltage signal; and an output circuit coupled to the first and second sensing circuits to generate a wideband output signal by combining the first and second signals.

2. The wideband current sensor of claim 1, wherein the first sensing circuit comprises a differential amplifier circuit having differential signal inputs that are DC-coupled to the sense element.

3. The wideband current sensor of claim 2, wherein the first sensing circuit further comprises a differential and common mode input filter that DC-couples the differential signal inputs to the sense element.

4. The wideband current sensor of claim 3, wherein the differential and common mode input fitter comprises a low-pass filter to impose an upper frequency limit on the signal components in the differential voltage signal that are passed to the differential signal inputs.

5. The wideband current sensor of claim 4, wherein the ratio of the common mode to differential mode inductance of the differential and common mode input filter is about 100:1.

6. The wideband current sensor of claim 2, wherein the differential amplifier circuit comprises an operational amplifier circuit.

7. The wideband current sensor of claim 2, wherein the differential amplifier circuit comprises an instrumentation amplifier circuit providing high common-mode signal rejection relative to me sense element.

8. The wideband current sensor of claim 2, wherein the differential amplifier circuit comprises a low-pass output filter having an upper-frequency roll-off matched to a lower frequency roll-off of the second sensing circuit.

9. The wideband current sensor of claim 1, wherein the first sensing circuit comprises a low-pass sensing circuit, and the second sensing circuit comprises a high-pass sensing circuit, and further wherein an upper frequency roll-oft of the first sensing circuit is matched to a lower-frequency roll-off of the second sensing circuit, such that the wideband output signal has a substantially flat frequency response across a frequency spectrum of interest.

10. The wideband current sensor of claim 1, wherein the second sensing circuit comprises a voltage-mode transformer.

11. The wideband current sensor of claim 10, wherein the voltage-mode transformer comprises first and second windings, and wherein the first winding is coupled in parallel to the sense element such that the differential voltage signal induced by the sense element appears across the first winding.

12. The wideband current sensor of claim 11, wherein the second winding has first and second ends, said first end being coupled to an output of the first sensing circuit providing the first signal, and said second end being coupled to a first input of the output circuit.

13. The wideband current sensor of claim 12, wherein the first end of the second winding is further coupled to a second input of the output circuit.

14. The wideband current sensor of claim 13, wherein the output of the first sensing circuit is also coupled to the second input of the output circuit, such that the output circuit receives both the first and second signals.

15. The wideband current sensor of claim 14, wherein the first and second inputs of the output circuit include input filters to compensate for a reactance of the sense element.

16. The wideband current sensor of claim 10, wherein the voltage-mode transformer comprises a segment-wound toroidal transformer having high common-mode rejection with respect to the differential voltage signal generated by the sense element.

17. The wideband current sensor of claim 1, wherein the output circuit comprises:
   a summing circuit comprising first and second summing inputs to receive the first and second signals, respectively; and
   a wideband output amplifier coupled to the summing circuit to generate the wideband output signal by amplifying a combined signal formed from the first and second signals.

18. The wideband current sensor of claim 17, wherein the sense element comprises a sense resistor, and wherein the summing circuit comprises an input filter circuit configured to compensate for a reactance of the sense resistor.

19. The wideband current sensor of claim 17, wherein the output circuit further comprises an output filter having an input receiving the wideband output signal and an output providing a filtered output signal.

20. The wideband current sensor of claim 19, wherein the output circuit further comprises a hysteretic comparator having a first input receiving the filtered output signal and an output providing a hysteretic switching signal responsive to the filtered output signal.

21. A hysteretic switching controller comprising the wideband current sensor of claim 20, and operative to provide switching control signals responsive to the hysteretic switching signal.

22. The wideband current sensor of claim 1, wherein the wicleband current sensor comprises a DC-to-30 MHz current sensor.

23. The wideband current sensor of claim 1, wherein the wideband current sensor comprises a high-side current sensor.

24. The wideband current sensor of claim 1, wherein the wideband current sensor comprises a low-Side current sensor.

25. A wideband current sensor comprising:
   a sense element to generate a differential sense signal proportional to a sensed current;
      a low-pass sensing circuit DC-coupled to the sense element to generate a first signal by amplifying lower frequency components of the differential sense signal, and wherein the first signal has a defined high frequency roll-off;
      a high-pass sensing circuit AC-coupled to the sense element to generate a second signal by amplifying higher frequency components of the differential sense signal, and wherein the second signal has a defined low frequency roll-off; and
      an output circuit to combine the first and second signals and to generate a wideband output signal at an output of the output circuit;
      said defined low frequency roll-off of the low-pass sensing circuit matched to the defined high frequency roll-off of the high-pass sensing circuit such that the wideband output signal exhibits a substantially flat frequency response across a wideband frequency spectrum of interest.

26. The wideband current sensor of claim 25, wherein the low-pass sensing circuit comprises:
   a differential filler DC-coupled to the sense element; and
   a differential amplifier circuit having differential inputs coupled to the differential filter, and having an output providing the first signal.

27. The wideband current sensor of claim 26, wherein the high-pass sensing circuit comprises a voltage-mode transformer.

28. The wideband current sensor of claim 27, wherein the transformer comprises a first winding coupled in parallel to the sense element, and a second winding coupling the output of the differential amplifier circuit in the low-pass sensing circuit to one of first and second summing inputs of the output circuit.

29. The wideband current sensor of claim 28, wherein the first winding of the transformer is coupled to first and second ends of the sense element through first and second resistors, respectively, and wherein the first and second resistors are sized relative TO a resistance of the sense element, such that substantially all of the sensed current flows through the sense element.

30. The wideband current sensor of claim 28, wherein the output of the differential amplifier circuit in the low-pass sensing circuit is coupled to the other one of first and second summing inputs of the output circuit, such that the output circuit receives both the first and second signals.

31. The wideband current sensor of claim 25, wherein a signal gain of the low-pass sensing circuit is matched with a signal gain of the high-pass sensing circuit.

32. The wideband current sensor of claim 25, wherein the output circuit comprises:
   a summing circuit having first and second summing inputs to receive the first and second signals; and
   an output amplifier circuit coupled to the summing circuit to generate the wideband output signal by amplifying a combination of the first and second signals.

33. A current sensor comprising:
   a sense element to receive a current and, in response, generate a differential voltage signal;
   a voltage-mode transformer circuit having a first winding coupled in parallel to the sense element such that the differential voltage signal appears across the first winding, and having a second winding to generate a sense signal responsive to the differential voltage signal; and
   an output circuit coupled to the second winding of the voltage-mode transformer to generate an output sense signal by amplifying the sense signal generated by the voltage-mode transformer.

34. The current sensor of claim 33, wherein the voltage-mode transformer comprises a segment-wound transformer for high common-mode signal rejection relative to the sensed current.

35. The current sensor of claim 33, wherein the voltage-mode transformer comprises a high permeability core to extend an upper sensing frequency of the current sensor.

36. The current sensor of claim 33, wherein first and second ends of the first winding of the voltage-mode transformer are respectively coupled to first and second ends of the sense element via series resistors, such that the path resistance through the first winding is substantially greater than the path resistance through the sense element.

37. A method of sensing a current of interest having wideband frequency components, the method comprising:
   generating a first signal based on sensing lower frequency components of the current, said lower frequency components including DC;
   generating a second signal based on sensing higher frequency components of the current;
   combining the first and second signals to generate a wideband output signal; and
   matching frequency-sensitive gains of the first and second signals such that the wideband output signal exhibits a substantially flat frequency response from DC to a maximum frequency of interest.

38. The method of claim 37, wherein generating the first signal comprises DC coupling a differential voltage signal from a current sense element to a differential amplifier.

39. The method of claim 38, further comprising low pass filtering the differential voltage signal to limit a maximum frequency seen by the differential amplifier.

40. The method of claim 38, further comprising low pass filtering an output signal of the differential amplifier to generate the first signal, such that the first signal has a desired frequency-sensitive gain.

41. The method of claim 37, wherein generating the second signal comprises coupling a first winding of a voltage-mode transformer to a current sense element.

42. The method of claim 41, further comprising coupling a second winding of the voltage-mode transformer to a summing circuit, such that the second winding of the voltage-mode transformer outputs the second signal for combining with the first signal by the summing circuit.

43. The method of claim 37, wherein generating the second signal comprises differentially coupling a voltage-mode transformer to a current sense element placed in series with the sensed current.

44. The method of claim 43, further comprising winding the voltage-mode transformer such that primary and secondary windings of voltage-mode transformer are physically spaced apart, thereby increasing common-mode signal rejection of me voltage-mode transformer.

45. The method of claim 37, further comprising summing the first and second signals at an input of an output amplifier circuit to combine the first and second signals.

46. The method of claim 45, further comprising providing input filtering at the input of the output amplifier circuit to compensate for a reactance of a current sensing resistor used for sensing the lower and higher frequency components in the sensed current.

47. The method of claim 37, further comprising driving a hysteretic comparator with the wideband output signal, such that a hysteretic switching controller controls a supply voltage based on feedback derived from the wideband output signal.

48. The method of claim 47, further comprising low pass filtering the wideband output signal to limit a maximum switching frequency of the hysteretic switching controller.

* * * * *